(12) United States Patent
Luoh

(10) Patent No.: US 6,962,861 B2
(45) Date of Patent: Nov. 8, 2005

(54) METHOD OF FORMING A POLYSILICON LAYER COMPRISING MICROCRYSTALLINE GRAINS

(75) Inventor: Tuung Luoh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/715,558

(22) Filed: Nov. 19, 2003

(65) Prior Publication Data

US 2005/0106842 A1 May 19, 2005

(51) Int. Cl.⁷ .......................... H01L 21/20; H01L 21/36
(52) U.S. Cl. ...................... 438/488; 438/647
(58) Field of Search .......................... 438/488, 489, 438/502, 509, 522, 585, 592, 593, 647, 698

(56) References Cited

U.S. PATENT DOCUMENTS

| | | | |
|---|---|---|---|
| 5,981,339 A | 11/1999 | Chang et al. | |
| 6,383,899 B1 | 5/2002 | Voutsas | |
| 6,667,525 B2 * | 12/2003 | Rhee et al. | 257/407 |
| 6,713,364 B2 * | 3/2004 | Kirchhoff | 438/409 |

OTHER PUBLICATIONS

T.C. Ong, et al., "Erratic Erase in ETOX™ Flash Memory Array," IEEE VLSI Symposium, 1993, pp. 83–84.
V. Subramanian et al., "A Novel Technique for 3–D Integration: Ge–seeded Laterally Crystallized TFTs", IEEE VLSI Symposium, 1997.
Tuung Luoh et al., "Single–Wafer Polysilicon Engineering for the Improvement of Over Erase in a 0.18–μm Floating–Gate Flash Memory," IEEE Transactions on Semiconductor Manufacturing, vol. 16, No. 2, May 2003, pp. 155–164.

* cited by examiner

Primary Examiner—Phuc T. Dang
(74) Attorney, Agent, or Firm—Akin Gump Strauss Hauer & Feld, LLP

(57) ABSTRACT

A method of forming a flash memory cell includes providing a substrate, forming an oxide layer over the substrate, forming a polysilicon floating gate over the oxide layer including providing a bottom seed layer having microcrystalline polysilicon, providing an upper amorphous silicon layer over the bottom seed layer, and annealing the upper amorphous silicon layer, providing an inter-poly dielectric layer over the floating gate, and forming a polysilicon control gate over the inter-poly dielectric layer.

19 Claims, 1 Drawing Sheet

METHOD OF FORMING A POLYSILICON LAYER COMPRISING MICROCRYSTALLINE GRAINS

FIELD OF THE INVENTION

The invention pertains in general to a method for fabricating a semiconductor device and, more particularly, to a method for forming a microcrystalline polysilicon layer in a semiconductor device.

BACKGROUND OF THE INVENTION

Polycrystalline silicon, also known as polysilicon, is generally deposited by thermal decomposition of silane ($SiH_4$) at a low pressure in a conventional semiconductor manufacturing process. A polysilicon layer is commonly used in the formation of a memory device, such as a flash memory device. In a flash memory device, a polysilicon layer may be provided for the formation of the floating gate and/or the control gate.

One popular conventional technique of providing a polysilicon layer is low pressure chemical vapor deposition ("LPCVD") because of its lower cost, higher production throughput, and superior film properties. Polysilicon is deposited at around 620° C. Alternatively, amorphous silicon may be deposited at a lower temperature, for example, 560° C. The amorphous silicon may then be transformed into polysilicon through annealing. However, the annealing process often produces a polysilicon layer with large grain boundaries, which may cause electron trapping at the polysilicon/gate oxide interface, and adversely affect the operations of the memory device. The cause of electron trapping is illustrated in FIG. 1.

FIG. 1 is a cross-sectional view of prior art semiconductor device. Referring to FIG. 1, a gate oxide 12 is formed on a substrate 10. A polycrystalline silicon film 14 provided through the LPCVD process is formed over gate oxide 12. As is known, polycrystalline silicon film 14 is made up of silicon crystallines separated by grain boundaries 16. One of the problems associated with the deposition of a polycrystalline silicon film is the formation of undesirable oxide valleys 18 at the interface between gate oxide 12 and polycrystalline silicon film 14. Valleys 18 may cause unintended trapping of electrons, particularly during erase operations, and causes non-uniform performance of the flash memory cell.

SUMMARY OF THE INVENTION

In accordance with the invention, there is provided a method of forming a polysilicon layer in a semiconductor device, including providing a substrate, forming an oxide layer over the substrate, depositing a first silicon layer over the oxide layer, wherein the first silicon layer comprises microcrystalline polysilicon, depositing an amorphous silicon layer over the first silicon layer, and annealing the amorphous silicon layer to form a polysilicon layer.

Also in accordance with the invention, there is provided a method of forming a flash memory cell, including providing a substrate, forming an oxide layer over the substrate, forming a polysilicon floating gate over the oxide layer including providing a bottom seed layer having microcrystalline polysilicon, providing an upper amorphous silicon layer over the bottom seed layer, and annealing the upper amorphous silicon layer, providing an inter-poly dielectric layer over the floating gate, and forming a polysilicon control gate over the inter-poly dielectric layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
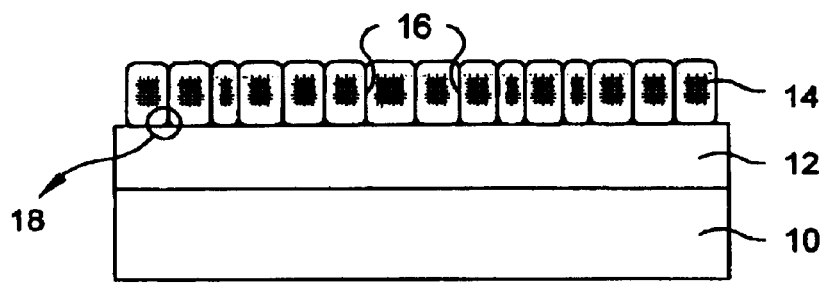
FIG. 1 is a cross-sectional view of a conventional poly gate structure.
Figure 2:
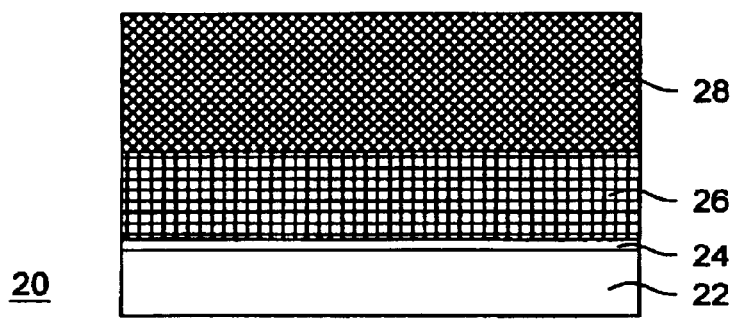
FIG. 2 is a cross-sectional view of a method of manufacturing a semiconductor device consistent with one embodiment of the present invention.
Figure 3:
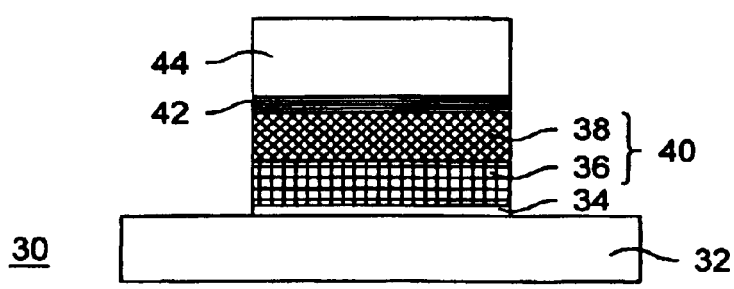
FIG. 3 is a cross-sectional view of a method of manufacturing a semiconductor device consistent with another embodiment of the present invention.

FIGS. 2 and 3 are cross-sectional views of semiconductor devices formed with a method consistent with an embodiment of the present invention. Referring to FIG. 2, a fabrication method of a semiconductor memory device 20 in accordance with one embodiment of the present invention begins by providing a substrate 22. Thereafter, a thin gate oxide layer 24 is formed over substrate 22. A first polysilicon layer 26 is then provided over gate oxide layer 24. First polysilicon layer 26 comprises microcrystalline polysilicon. In one embodiment, polysilicon layer 26 has a thickness of between about 50 to 2,000 angstroms. In addition, first polysilicon layer 26 may be provided through LPCVD in the presence of a reactive gas containing silicon and a carrier gas. The reactive gas containing silicon can be selected from the group consisting of $SiH_4$, $SiH_2Cl_2$, $SiD_4$, $SiD_2Cl_2$, $SiDCl_3$, $SiHCl_3$, $SiD_3Cl$, and $SiH_3Cl$ with flow rate of about 20 sccm to 1,600 sccm. The carrier gas can be selected from the group consisting of $H_2$, $D_2$ and $D_3$ with flow rate of about 100 sccm to 5,000 sccm.

In one embodiment, first polysilicon layer 26 is formed by depositing a microcrystalline silicon layer over gate oxide layer 24 through LPCVD at a furnace temperature of about 500° C. to 700° C., and a pressure between about 0.2 m torr and 5 torr, whereas a single wafer process is performed at a temperature of about 580° C. to 800° C., and a pressure between about 150 torr and 500 torr. In another embodiment, first polysilicon layer 26 is formed through single wafer LPCVD at a chamber temperature of about 650° C. to 750° C., and at a pressure of about 50 torr to 500 torr.

Second polysilicon layer 28 is formed by depositing an amorphous silicon layer over first polysilicon layer 26. Amorphous silicon layer may be provided through any conventional method. The deposition of the amorphous silicon layer is followed by an annealing process to form second polysilicon layer 28. In one embodiment, second polysilicon layer 28 has a thickness of about 100 to 2,000 angstroms.

Due to the presence of first polysilicon layer 26, the grain size of second polysilicon layer 28 is more random and smaller than that formed by the conventional deposition processes. As a result, the combined first and second polysilicon layers 26 and 28 are easier to pattern and etch. In addition, by minimizing, or eliminating, the presence of valleys that cause electron trapping at the interface between the polysilicon layer and the gate oxide layer, the flash memory device formed with the method of the present invention exhibits a faster erase.

Referring to FIG. 3, the combined polysilicon layers 26 and 28 may be used as the floating gate in a flash memory device. A flash memory device 30 includes a substrate 32, an oxide layer 34 formed over substrate 32, and a polysilicon floating gate 40 formed over oxide layer 34. Floating gate 40 is formed through the two-step deposition process described above, wherein a bottom layer of microcrystalline silicon 36 is formed first, followed by the formation of an upper polysilicon layer 38 by first providing a layer of amorphous silicon and then annealing the layer of amorphous silicon. Memory cell 30 further includes an inter-poly dielectric layer 42 formed over floating gate 40 and a polysilicon control gate 44 formed over inter-poly dielectric layer 42. Inter-poly dielectric layer 42 may be a three-layered material, including a nitride layer sandwiched between two oxide layers, i.e., a so-called "ONO" type structure.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a polysilicon layer in a semiconductor device, comprising:

providing a substrate;

forming an oxide layer over the substrate;

depositing a first silicon layer over the oxide layer, wherein the first silicon layer comprises microcrystalline polysilicon, wherein the step of depositing a first silicon layer is performed with a low pressure chemical vapor deposition in the presence of a reactive gas containing silicon and a carrier gas, and wherein the reactive gas containing silicon is selected from the group consisting of $SiH_4$, $SiH_2Cl_2$, $SiD_4$, $SiD_2Cl_2$, $SiDCl_3$, $SiHCl_3$, $SiD_3Cl$, and $SiH_3Cl$;

depositing an amorphous silicon layer over the first silicon layer; and annealing the amorphous silicon layer to form a polysilicon layer.

2. The method as claimed in claim 1, wherein the step of depositing a first silicon layer is performed at a furnace temperature of about 500° C. to 700° C.

3. The method as claimed in claim 1, wherein the step of depositing a first silicon layer is performed at a furnace pressure between about 0.2 m torr and 5 torr.

4. The method as claimed in claim 1, wherein the first silicon layer has a thickness of about 50 to 2,000 angstroms.

5. The method as claimed in claim 1, wherein the amorphous silicon layer has a thickness of about 100 to 2,000 angstroms.

6. A method of forming a flash memory cell, comprising:

providing a substrate;

forming an oxide layer over the substrate;

forming a polysilicon floating gate over the oxide layer including providing a bottom seed layer having microcrystalline polysilicon, providing an upper amorphous silicon layer over the bottom seed layer, and annealing the upper amorphous silicon layer;

providing an inter-poly dielectric layer over the polysilicon floating gate; and forming a polysilicon control gate over the inter-poly dielectric layer.

7. The method as claimed in claim 6, wherein the step of providing a bottom seed layer is performed at a furnace temperature of about 500° C. to 700° C.

8. The method as claimed in claim 6, wherein the step of providing a bottom seed layer is performed with a single wafer low pressure chemical vapor deposition at a chamber temperature of about 650° C. to 750° C.

9. The method as claimed in claim 6, wherein the step of providing a bottom seed layer is performed at a furnace pressure of between about 0.2 m torr and 5 torr.

10. The method as claimed in claim 6, wherein the step of providing a bottom seed layer is performed with a single wafer low pressure chemical vapor deposition at a pressure of about 50 torr to 500 torr.

11. The method as claimed in claim 6, wherein the deposition of the bottom seed layer is performed with a low pressure chemical vapor deposition in the presence of a reactive gas containing silicon and a carrier gas.

12. The method as claimed in claim 11, wherein the reactive gas containing silicon is selected from the group consisting of $SiH_4$, $SiH_2Cl_2$, $SiD_4$, $SiD_2Cl_2$, $SiDCl_3$, $SiHCl_3$, $SiD_3Cl$, and $SiH_3Cl$.

13. The method as claimed in claim 12, wherein the flow rate of the reactive gas containing silicon is about 20 sccm to 1,600 sccm.

14. The method as claimed in claim 11, wherein the carrier gas is selected from the group consisting of $H_2$, $D_2$ and $D_3$.

15. The method as claimed in claim 14, wherein the flow rate of the carrier gas is about 100 sccm to 5,000 sccm.

16. The method as claimed in claim 6, wherein the bottom seed layer has a thickness of about 50 to 2,000 angstroms.

17. The method as claimed in claim 6, wherein the upper amorphous silicon layer has a thickness of about 100 to 2,000 angstroms.

18. A method of forming a polysilicon layer in a semiconductor device, comprising:

providing a substrate;

forming an oxide layer over the substrate;

depositing a first silicon layer over the oxide layer, wherein the first silicon layer comprises microcrystalline polysilicon, wherein the step of depositing a first silicon layer is performed with a lower pressure chemical vapor deposition in the presence of a reactive gas containing silicon and a carrier gas, and wherein the carrier gas is selected from the group consisting of $H_2$, $D_2$ and $D_3$;

depositing an amorphous silicon layer over the first silicon layer; and annealing the amorphous silicon layer to form a polysilicon layer.

19. The method as claimed in claim 18, wherein the flow rate of the carrier gas is about 100 sccm to 5,000 sccm.

* * * * *